US012689109B2

(12) United States Patent
Yeh

(10) Patent No.: US 12,689,109 B2
(45) Date of Patent: Jul. 21, 2026

(54) COUPLER STRUCTURE AND RELATED RADIO FREQUENCY CIRCUIT

(71) Applicant: RichWave Technology Corp., Taipei City (TW)

(72) Inventor: Chia-Jung Yeh, Taipei City (TW)

(73) Assignee: RichWave Technology Corp., Taipei City (TW)

( * ) Notice: Subject to any disclaimer, the term of this patent is extended or adjusted under 35 U.S.C. 154(b) by 319 days.

(21) Appl. No.: 18/391,697

(22) Filed: Dec. 21, 2023

(65) Prior Publication Data

US 2025/0149768 A1 May 8, 2025

(30) Foreign Application Priority Data

Nov. 6, 2023 (TW) ................................. 112142657

(51) Int. Cl.
 *H01P 5/18* (2006.01)
 *H01Q 23/00* (2006.01)
 (Continued)

(52) U.S. Cl.
 CPC ............. *H01P 5/184* (2013.01); *H01Q 23/00* (2013.01); *H04B 1/0475* (2013.01);
 (Continued)

(58) Field of Classification Search
 CPC .......... H01P 5/185; H01P 5/187; H01P 5/184; H01P 5/18; H01P 3/08; H01P 3/081; H01P 5/16; H01P 5/10; H01P 1/20336; H01P 1/20363; H01P 5/00; H01P 5/183;

H01P 1/04; H01P 1/184; H01P 3/026; H01P 5/028; H01P 5/12; H01P 1/02; H01P 1/15; H01P 1/185; H01P 1/20; H04B 1/0458;
 (Continued)

(56) References Cited

U.S. PATENT DOCUMENTS 2,872,577 A * 2/1959 Hart ......................... H03D 1/00
455/337
12,199,585 B2 * 1/2025 Azizi ....................... H03H 7/38
 (Continued)

FOREIGN PATENT DOCUMENTS

WO 2023/093358 A1 6/2023

OTHER PUBLICATIONS

Office action mailed on Jan. 3, 2025 for the Taiwan application No. 112142657, filing date Nov. 6, 2023, pp. 1-4.

*Primary Examiner* — Golam Sorowar
(74) *Attorney, Agent, or Firm* — Winston Hsu

(57) ABSTRACT

A coupler structure includes a main signal line, a first coupling line, a second coupling line and a spacer element. The main signal line is located on a first plane, the first coupling line is located on a second plane, and the second coupling line is located on a third plane, wherein the second plane and the third plane are both in parallel with the first plane, and the second plane and the third plane are both different from the first plane. The spacer element is connected to the main signal line. The projection of the spacer element on the first plane is located between the projection of the first coupling line on the first plane and the projection of the second coupling line on the first plane. The main signal line, the first coupling line and the second coupling line extend along a virtual line.

18 Claims, 12 Drawing Sheets

(51) Int. Cl.
　　*H03F 3/19*　　　　(2006.01)
　　*H04B 1/04*　　　　(2006.01)
　　*H04B 17/10*　　　(2015.01)

(52) U.S. Cl.
　　CPC ............. *H04B 17/104* (2015.01); *H03F 3/19*
　　　　　　　(2013.01); *H03F 2200/451* (2013.01)

(58) Field of Classification Search
　　CPC ... H04B 1/44; H04B 5/79; H04B 5/48; H04B
　　　　　1/006; H04B 1/16; H04B 17/103; H04B
　　　　　17/16; H04B 17/309; H04B 2203/5483;
　　　　　　　　　　　　　　H04B 5/02
　　See application file for complete search history.

(56) References Cited

U.S. PATENT DOCUMENTS

| | | | | |
|---|---|---|---|---|
| 2005/0017821 A1* | 1/2005 | Sawicki | .................. | H01P 5/187 |
| | | | | 333/116 |
| 2005/0212617 A1* | 9/2005 | Chen | ....................... | H01P 5/185 |
| | | | | 333/116 |
| 2014/0368293 A1* | 12/2014 | Mukaiyama | ........... | H03H 7/383 |
| | | | | 333/116 |
| 2021/0105026 A1* | 4/2021 | Schwerg | .............. | H04B 1/0458 |
| 2023/0113980 A1* | 4/2023 | Furutani | ................. | H01P 5/187 |
| | | | | 333/109 |

\* cited by examiner

COUPLER STRUCTURE AND RELATED RADIO FREQUENCY CIRCUIT

CROSS REFERENCE TO RELATED APPLICATION

This application claims the priority benefit of Taiwan application serial no. 112142657, filed on Nov. 6, 2023. The content of the application is incorporated herein by reference.

TECHNICAL FIELD

The present invention is related to a coupler structure and a related radio frequency circuit, and more particularly, to a coupler structure a related radio frequency circuit capable of increasing coupling factor and improving signal isolation.

BACKGROUND

With the widespread of wireless networks, radio frequency (RF) applications are required for mobile phones, cars, tablets, base stations, network access points, laptops, or Internet of Things (IoT) devices, which greatly increase the use of RF circuits in electronic systems. An RF circuit refers to a circuit in which the electromagnetic wavelength of the processing signal is on the same order of magnitude as the circuit or device size. In a prior art communication device, a coupler is usually disposed in the transmission line of the RF circuit in order to solve related problems caused by power distribution, as well as to accurately monitor the RF energy in the circuit without causing a large amount of signal loss in the transmission lines and the load.

A coupler may interfere with main signals, and is able to differentiate between forward power and reflected power and allow the return loss or the standing wave ratio to be monitored, thereby providing feedback on load changes during signal transmission. Under such circumstance, there is a need for a coupler structure capable of monitoring RF power levels while reducing signal losses in the transmission lines and the load.

SUMMARY

The present invention provides a coupler structure which includes a main signal, a first coupling line, a second coupling line and a spacer element. The main signal line is located on a first plane. The first coupling line is located on a second plane, wherein the second plane is in parallel with the first plane and the second plane is different from the first plane. The second coupling line is located on a third plane, wherein the third plane is in parallel with the first plane and the third plane is different from the first plane. The spacer element connected to the main signal line. A projection of the spacer element on the first plane is located between a projection of the first coupling line on the first plane and a projection of the second coupling line on the first plane. The main signal line, the first coupling line and the second coupling line extend along a virtual line.

The present invention also provides an RF circuit which includes an RF signal transmitting end, a first RF signal output end, a second RF signal output end, a main signal, a first coupling line, a second coupling line, a spacer element and a power detector. The main signal line is located on a first plane, wherein a first node of the main signal line is connected to the RF signal transmitting end and a second node of the main signal line is connected to the first RF signal output end. The first coupling line is located on a second plane, wherein the second plane is in parallel with the first plane, the second plane is different from the first plane, and a first node of the first coupling signal line is connected to the second RF signal output end. The second coupling line is located on a third plane, wherein the third plane is in parallel with the first plane and the third plane is different from the first plane. The spacer element is connected to the main signal line. The power detector is coupled to a first node of the second coupling line. A projection of the spacer element on the first plane is located between a projection of the first coupling line on the first plane and a projection of the second coupling line on the first plane. A main coupling part of the main signal line, a first coupling part of the first coupling line, a second coupling part of the second coupling line and the spacer element form a coupling structure. The main signal line, the first coupling part and the second coupling part extend along a virtual line.

DETAILED DESCRIPTION

Figure 1:
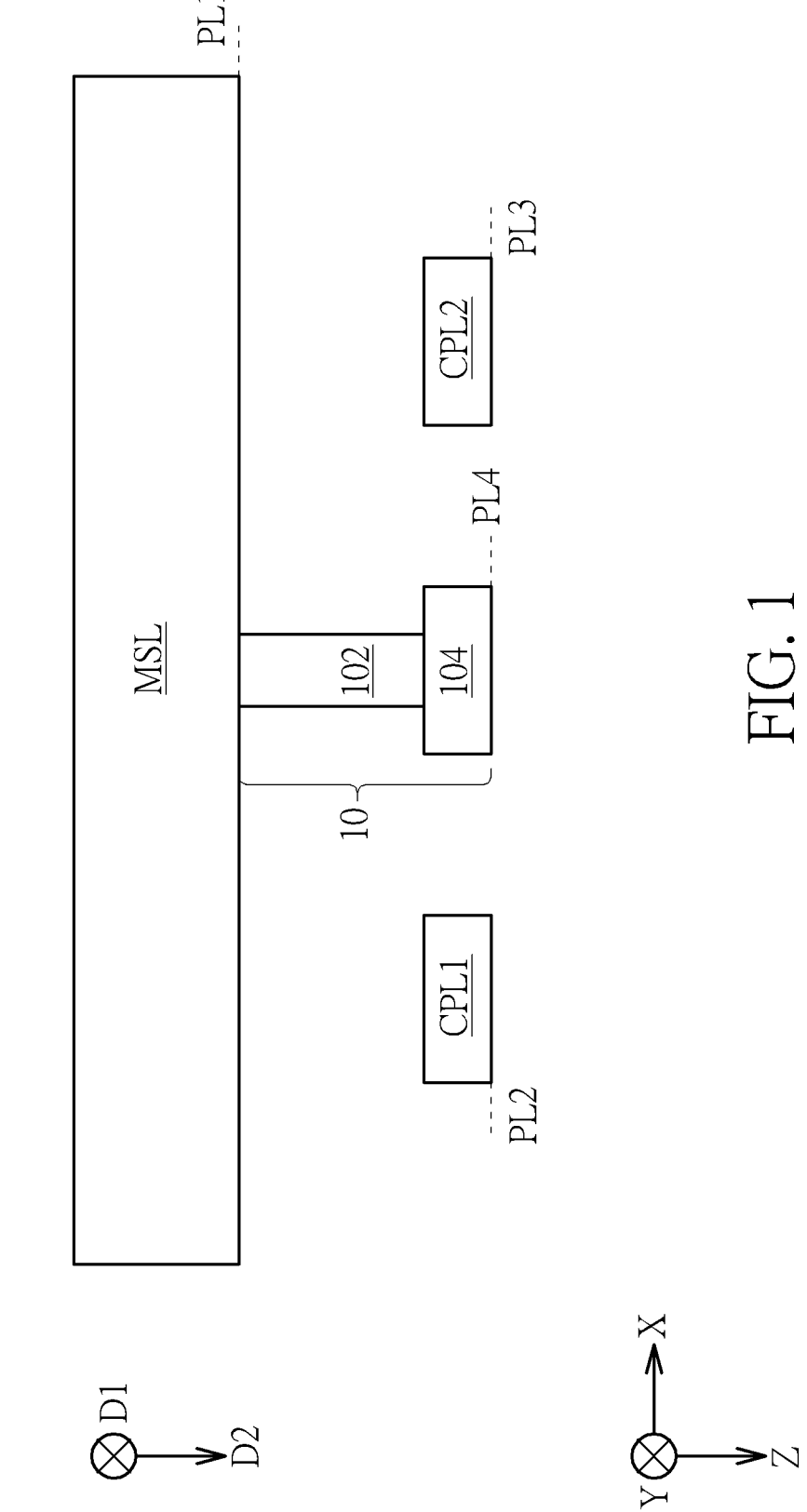
FIG. 1 is a diagram illustrating a coupler structure according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a diagram illustrating a coupler structure 100 according to an embodiment of the present invention. The coupler structure 100 includes a main signal line MSL, a first coupling line CPL1, a second coupling line CPL2, and a spacer element 10. For illustrative purpose, the coordinate system of the coupler structure 100 is denoted by an X-axis, a Y-axis and a Z-axis, wherein the X-axis, the Y-axis and the Z-axis are perpendicular to each other.

FIG. 1 depicts the cross-sectional view of the coupler structure 100 along an X-Z plane, wherein the main signal line MSL is located on a first plane PL1, the first coupling line CPL1 is located on a second plane PL2, and the second coupling line CPL2 is located on a third plane PL3. The second plane PL2 is in parallel with the first plane PL1, and the third plane PL3 is in parallel with the first plane PL1. Furthermore, in the embodiment depicted in FIG. 1, the first plane PL1, the second plane PL2 and the third plane PL3 are for example all in parallel with the X-Y plane, and the second plane PL2 and the third plane PL3 are both different from the first plane PL1. In the embodiment depicted in FIG. 1, the second plane PL2 and the third plane PL3 are for example coplanar, which means that the distance between the first plane PL1 and the second plane PL2 is equal to the distance between the first plane PL1 and the third plane PL3. Moreover, in other embodiments, the second plane PL2 and the third plane PL3 may be non-coplanar. In the embodiment depicted in FIG. 1, the main signal line is for example a signal transmission line formed by a single metal layer. In other embodiments, the main signal line MSL may be a signal transmission line formed by multiple metal layers (not shown in FIG. 1) and is thus thicker than the signal transmission line formed by a single metal layer. This way, the insertion loss of the main signal line MSL may be further reduced by increasing the thickness of the main signal line MSL.

In the embodiment depicted in FIG. 1, the spacer element 10 is connected to the main signal line MSL, and the projection of the spacer element 10 on the first plane PL1 is located between the projection of the first coupling line CPL1 on the first plane PL1 and the projection of the second coupling line CPL2 on the first plane PL1. Also, in the embodiment depicted in FIG. 1, the spacer element 10 extends along a second direction D2 for separating the first coupling line CPL1 and the second coupling line CPL2, wherein the second direction D2 is not in parallel with a first direction D1. In an embodiment of the present invention, the second direction D2 may be for example the direction of the Z-axis, which means that the second direction D2 may be for example perpendicular to the first direction D1.

In the embodiment depicted in FIG. 1, the spacer element 10 includes a first spacer part 102 and a second spacer part 104. The first spacer part 102 is connected between the main signal line MSL and the second spacer part 104 along the second direction D2. The second spacer part 104 is located on a fourth plane PL4 which is in parallel with the first plane PL1. In the embodiment depicted in FIG. 1, the fourth plane PL4 is for example in parallel with the X_Y plane, and the fourth plane PL4 is different from the first plane PL1. Also, the second plane PL2, the third plane PL3 and the fourth plane PL4 may be coplanar. Furthermore, the first end of the first spacer part 102 is connected to the main signal line MSL, the second end of the first spacer part 102 is connected to the second spacer part 104, the first end of the second spacer part 104 is connected to the second end of the first spacer part 102, and the second end of the second spacer part 104 is located on the fourth plane PL4. This way, the junction of the first end of the first spacer part 102 and the main signal line MSL is located between the projection of the first coupling line CPL1 on the first plane PL1 and the projection of the second coupling line CPL2 on the first plane PL1.

In the embodiment depicted in FIG. 1, the first coupling line CPL1 and the second coupling line CPL2 may couple signals from the main signal line MSL and the spacer element 10. In an embodiment, the spacer element is a conductor, wherein the first spacer part 102 includes a plurality of conductor vias disposed along the first direction D1 or is a conductor wall extending along the first direction D1, and the second spacer part 102 is a conductor block extending along the first direction D1, but is not limited thereto. Furthermore, in some embodiments, the second spacer part 104, the first coupling line CPL1 and the second coupling line CPL2 may be manufactured in the same process so that the second spacer part 104, the first coupling line CPL1 and the second coupling line CPL2 have substantially the same thickness along the second direction D2. In other embodiments, the second spacer part 104, the first coupling line CPL1 and the second coupling line CPL2 may be manufactured in different processes, and the second spacer part 104, the first coupling line CPL1 and the second coupling line CPL2 may have different thickness along the second direction D2.

In the embodiment depicted in FIG. 1, since the spacer element 10 extends along the second direction D2 for separating the first coupling line CPL1 and the second coupling line CPL2, the spacer element 10 is able to isolate the signals transmitted on the first coupling line CPL1 from the signals transmitted on the second coupling line CPL2. Particularly when the signals transmitted on the first coupling line CPL1 and the signals transmitted on the second coupling line CPL2 have the same phase, the spacer element 10 is able to reduce the signal inter-coupling between the first coupling line CPL1 and the second coupling line CPL2, thereby preventing the amount of signal coupled from main signal line MSL from dropping and reducing the deterioration in coupler directivity. In addition, since the spacer element 10 is a conductor disposed between the first coupling line CPL1 and the second coupling line CPL2, the parts of the first coupling line CPL1 and the second coupling line CPL2 facing towards the spacer element 10 may further couple signals from the spacer element 10 (originated from the main signal line MSL), thereby increasing the overall coupling factor of the coupler structure 100. Also, since the second spacer part 104 of the spacer element 10 may be for example be coplanar with the first coupling line CPL1 located on the second plane PL2 and the second coupling line CPL2 located on the third plane PL3 and the thickness of the second spacer part 104 along the X-axis is greater than the thickness of the first spacer part 102 along the X-axis, the second spacer part 104 may be located near the first coupling line CPL1 and the second coupling line CPL2. Under such circumstance, the signal coupling between the first coupling line CPL1 and the second coupling line CPL2 may be increased, thereby enabling the first coupling line CPL1 and the second coupling line CPL2 to couple more signals (originated from the main signal line MSL) from the spacer element 10.

Figure 2:
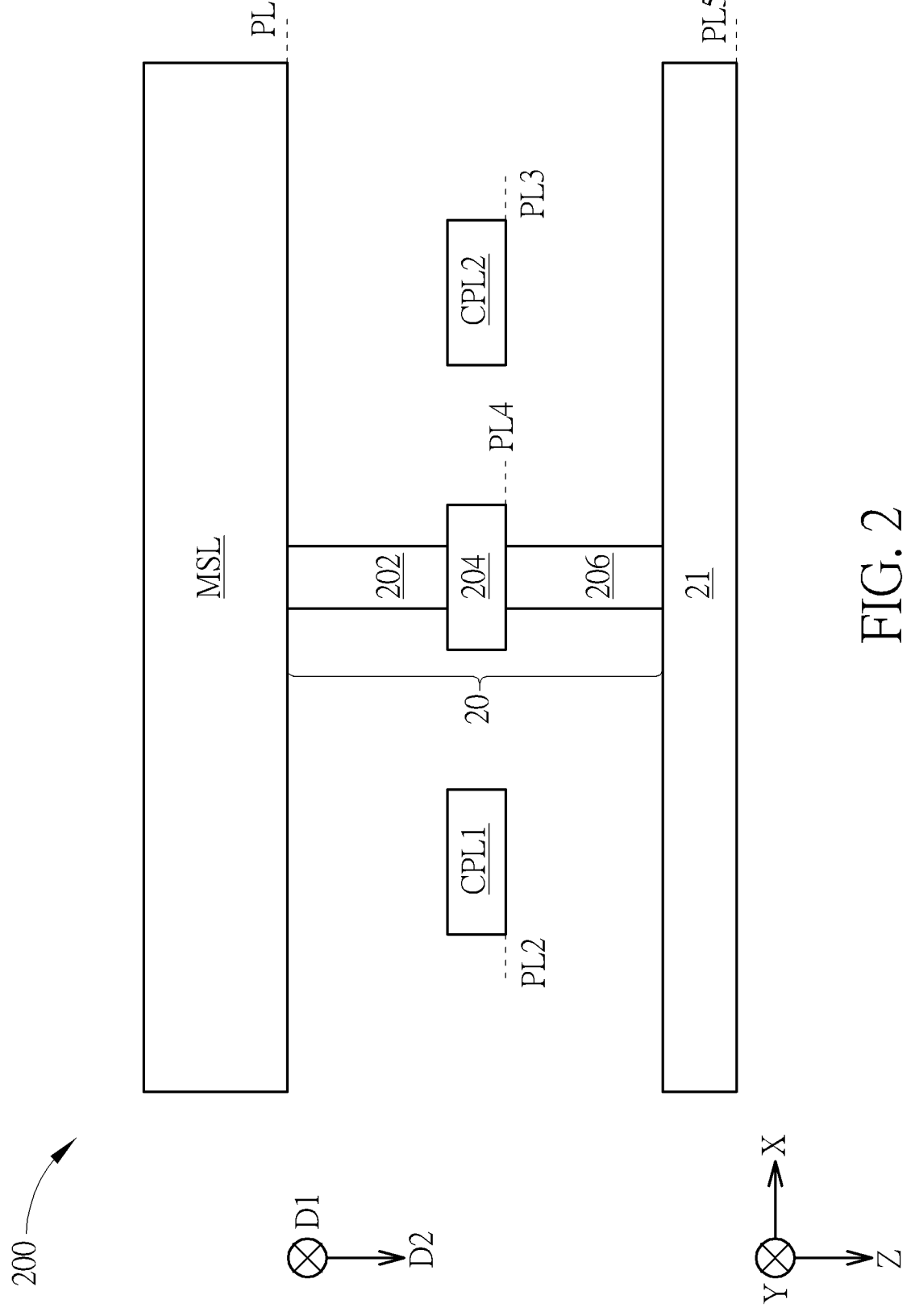
FIG. 2 is a diagram illustrating a coupler structure according to another embodiment of the present invention.

FIG. 2 is a diagram illustrating a coupler structure 200 according to another embodiment of the present invention. The coupler structure 200 includes a main signal line MSL, a first coupling line CPL1, a second coupling line CPL2, a spacer element 20, and a conductor layer 21. For illustrative purpose, the coordinate system of the coupler structure 200 is denoted by an X-axis, a Y-axis and a Z-axis, wherein the X-axis, the Y-axis and the Z-axis are perpendicular to each other. Furthermore, the coupler structure 200 depicted in FIG. 2 is similar to the coupler structure 100 depicted in FIG. 1, but differs from the coupler structure 100 in that the coupler structure 200 further includes the conductor layer 21 and the spacer elements 10 and 20 have different structures. In order to avoid repetitiveness, the description of the coupler structure 200 similar to the coupler structure 100 will be omitted.

FIG. 2 depicts the cross-sectional view of the coupler structure 200 along the X-Z plane, wherein the main signal line MSL is located on a first plane PL1, the first coupling line CPL1 is located on a second plane PL2, and the second coupling line CPL2 is located on a third plane PL3. The second plane PL2 is in parallel with the first plane PL1, and the third plane PL3 is in parallel with the first plane PL1. Furthermore, in the embodiment depicted in FIG. 2, the first plane PL1, the second plane PL2 and the third plane PL3 are for example all in parallel with the X-Y plane, and the second plane PL2 and the third plane PL3 are both different from the first plane PL1.

In the embodiment depicted in FIG. 2, the spacer element 20 includes a first spacer part 202, a second spacer part 204 and a third spacer part 206. The first spacer part 202 is connected to the main signal line MSL, the third spacer part 206 is connected to the conductor layer 21, and the second spacer part 204 is connected between the first spacer part 202 and the third spacer part 206. Furthermore, the first end of the first spacer part 202 is connected to the main signal line MSL, and the second end of the first spacer part 202 is connected to the second spacer part 204. The first end of the second spacer part 204 is connected to the second end of the first spacer part 202, and the second end of the second spacer part 204 is located on a fourth plane PL4. The first end of the third spacer part 206 is connected to the second end of the second spacer part 204, and the second end of the third spacer part 206 is connected to the conductor layer 21. The projection of the spacer element 20 on the first plane PL1 is located between the projection of the first coupling line CPL1 on the first plane PL1 and the projection of the second coupling line CPL2 on the first plane PL1. In other words, the junction of the first end of the first spacer part 202 and the main signal line MSL is located between the projection of the first coupling line CPL1 on the first plane PL1 and the projection of the second coupling line CPL2 on the first plane PL1.

In the embodiment depicted in FIG. 2, the conductor layer 21 is located on a fifth plane PL5, wherein the fourth plane PL4 is located between the first plane PL1 and the fifth plane PL5. The fourth plane PL4 and the fifth plane PL5 are for example both in parallel with the X-Y plane, and the fifth plane PL5 is different from the first plane PL1, the second plane PL2 and the third plane PL3. In the embodiment depicted in FIG. 2, the second plane PL2, the third plane PL3 and the fourth plane PL4 are for example coplanar, which means that the distance between the first plane PL1 and the second plane PL2, the distance between the first plane PL1 and the third plane PL3 and the distance between the first plane PL1 and the fourth plane PL4 are substantially equal.

In the embodiment depicted in FIG. 2, the second plane PL2 is located between the first plane PL1 and the fifth plane PL5, and the third plane PL3 is located between the first plane PL1 and the fifth plane PL5. In other words, the first coupling line CPL1 and the second coupling line CPL2 are located between the main signal line MSL and the conductor layer 21.

In the embodiment depicted in FIG. 2, the first coupling line CPL1 and the second coupling line CPL2 may couple signals from the main signal line MSL, the spacer element 20 and the conductor layer 21. In an embodiment, the spacer element 20 is a conductor, wherein the first spacer part 202 includes a plurality of conductor vias disposed along the first direction D1 or is a conductor wall extending along the first direction D1, the second spacer part 204 is a conductor block extending along the first direction D1, and the third spacer part 206 includes a plurality of conductor vias disposed along the first direction D1 or is a conductor wall extending along the first direction D1, but is not limited thereto. Furthermore, the first spacer part 202, the second spacer part 204 and the third spacer part 206 may be manufactured in the same process or in different processes so that the first spacer part 202, the second spacer part 204 and the third spacer part 206 have the same thickness or different thickness along the X-axis.

In the embodiment depicted in FIG. 2, since the spacer element 20 extends along the second direction D2 for separating the first coupling line CPL1 and the second coupling line CPL2, the spacer element 20 is able to isolate the signals transmitted on the first coupling line CPL1 from the signals transmitted on the second coupling line CPL2. Particularly when the signals transmitted on the first coupling line CPL1 and the signals transmitted on the second coupling line CPL2 have the same phase, the spacer element 20 is able to reduce the signal inter-coupling between the first coupling line CPL1 and the second coupling line CPL2, thereby preventing the amount of signal coupled from main signal line MSL from dropping and reducing the deterioration in coupler directivity. In addition, since the spacer element 20 is a conductor disposed between the first coupling line CPL1 and the second coupling line CPL2, the parts of the first coupling line CPL1 and the second coupling line CPL2 facing towards the spacer element 20 may further couple signals from the spacer element 20 (originated from the main signal line MSL), thereby increasing the overall coupling factor of the coupler structure 200. Also, since the coupler structure 200 includes the conductor layer 21 located on the fifth plane PL5, the second plane PL2 is located between the first plane PL1 and the fifth plane PL5, and the third plane PL3 is located between the first plane PL1 and the fifth plane PL5, the parts of the first coupling line CPL1 and the second coupling line CPL2 facing towards the conductor layer 21 may further increase the inter-coupling with the conductor layer 21, thereby enabling the first coupling line CPL1 and the second coupling line CPL2 to couple more signals from the conductor layer 21 (originated from the main signal line MSL).

Figure 3:
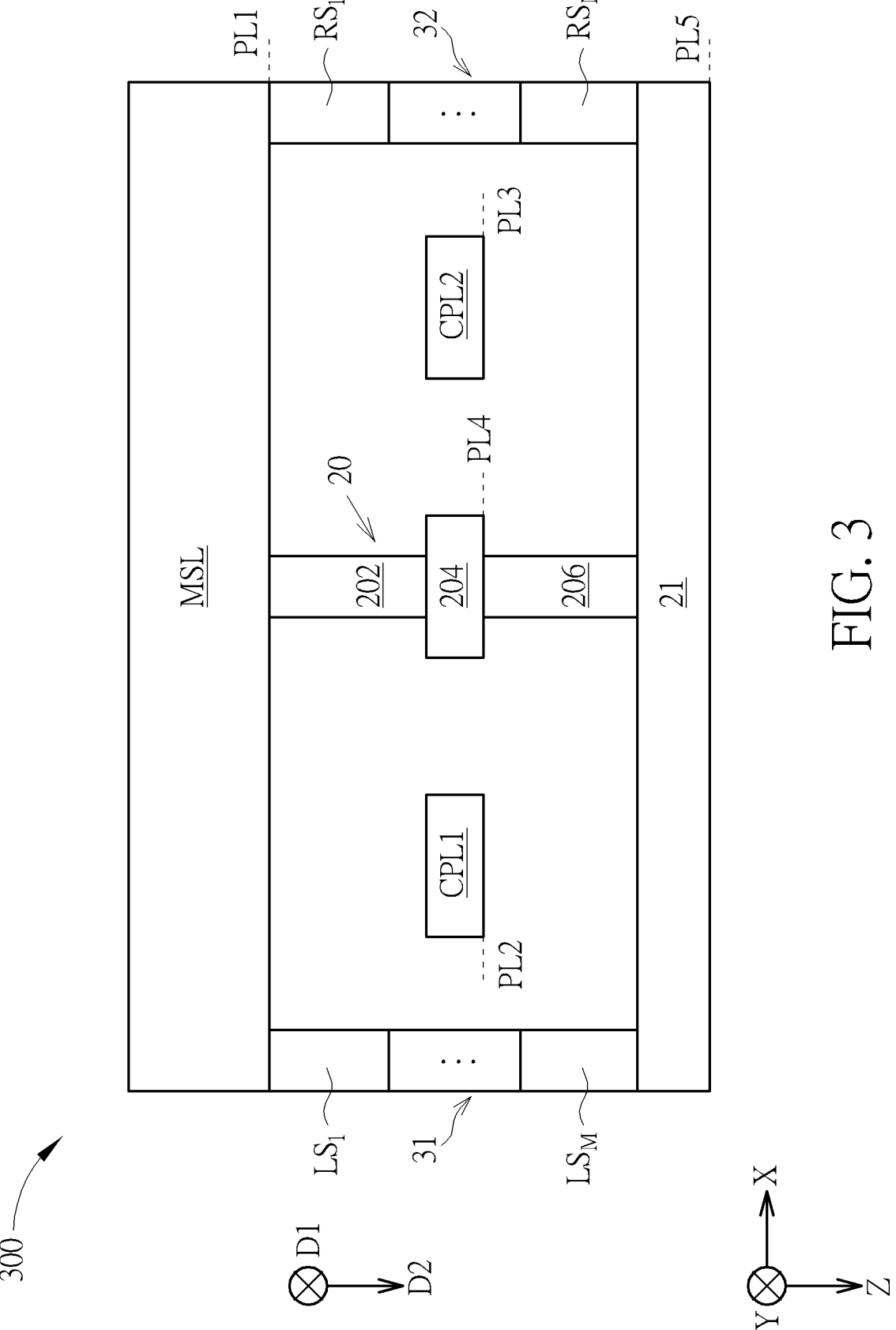
FIG. 3 is a diagram illustrating a coupler structure according to another embodiment of the present invention.

FIG. 3 is a diagram illustrating a coupler structure 300 according to another embodiment of the present invention. The coupler structure 300 includes a main signal line MSL, a first coupling line CPL1, a second coupling line CPL2, a spacer element 20, a conductor layer 21, a first lateral element 31 and a second lateral element 32. For illustrative purpose, the coordinate system of the coupler structure 300 is denoted by an X-axis, a Y-axis and a Z-axis, wherein the X-axis, the Y-axis and the Z-axis are perpendicular to each other. Furthermore, the coupler structure 300 depicted in FIG. 3 is similar to the coupler structure 200 depicted in FIG. 2, but differs from the coupler structure 200 in that the coupler structure 300 further includes the first lateral element 31 and the second lateral element 32. In order to avoid repetitiveness, the description of the coupler structure 300 similar to the coupler structure 200 will be omitted.

FIG. 3 depicts the cross-sectional view of the coupler structure 300 along the X-Z plane, wherein the main signal line is located on a first plane PL1, the first coupling line CPL1 is located on a second plane PL2, and the second coupling line CPL1 is located on a third plane PL3. The second plane PL2 is in parallel with the first plane PL1, and the third plane PL3 is in parallel with the first plane PL1. Furthermore, in the embodiment depicted in FIG. 3, the first plane PL1, the second plane PL2 and the third plane PL3 are for example all in parallel with the X-Y plane, and the second plane PL2 and the third plane PL3 are both different from the first plane PL1.

The spacer element 20 and the conductor layer 21 depicted in the embodiment of FIG. 3 are similar to those depicted in the embodiment of FIG. 2, and will not be elaborated. Furthermore, in the embodiment depicted in FIG. 3, the first lateral element 31 includes lateral parts $LS_1$-$LS_M$ and the second lateral element 32 includes lateral parts $RS_1$-$RS_N$, wherein M and N are positive integers. The first lateral element 31 and the second lateral element 32 respectively extend along the second direction D2 and are connected between the main signal line MSL and the conductor layer 21, wherein the spacer element 20 is located between the first lateral element 31 and the second lateral element 32.

In the embodiment depicted in FIG. 3, the first coupling line CPL1 and the second coupling line CPL2 may couple signals from the main signal line MSL, the spacer element 20, the conductor layer 21, the first lateral element 31 and the second lateral element 32. In an embodiment, the spacer element 20 is a conductor, wherein the first spacer part 202 includes a plurality of conductor vias disposed along the first direction D1 or is a conductor wall extending along the first direction D1, the second spacer part 204 is a conductor block extending along the first direction D1, and the third spacer part 206 includes a plurality of conductor vias disposed along the first direction D1 or is a conductor wall extending along the first direction D1, but is not limited thereto. In an embodiment, each of the first lateral element 31 and the second lateral element 32 is a conductor, wherein each lateral part includes a plurality of conductor vias disposed along the first direction D1, is a conductor wall extending along the first direction D1, or is a conductor block extending along the first direction D1, but is not limited thereto. In an embodiment, each of the first lateral element 31 and the second lateral element 32 is an integrally-formed conductor structure (M=N=1). In another embodiment, the first lateral element 31 may include lateral parts $LS_1$, $LS_2$ and $LS_3$, wherein the lateral part $LS_1$ is a conductor via or a conductor wall, the lateral part $LS_2$ is a conductor block, and the lateral part $LS_3$ is a conductor via or a conductor wall; the second lateral element 32 may include lateral parts $RS_1$, $RS_2$, and $RS_3$, wherein the lateral part $RS_1$ is a conductor via or a conductor wall, the lateral part $RS_2$ is a conductor block, and the lateral part $RS_3$ is a conductor via or a conductor wall. Also, the lateral part $LS_2$, the lateral part $RS_2$, the second plane PL2, the third plane PL3 and the fourth plane PL4 may be coplanar. Furthermore, in some embodiments, the second spacer part 204, the first coupling line CPL1, the second coupling line CPL2, one lateral part of the first lateral element 31 and one lateral part of the second lateral element 32 may be manufactured in the same process so that the second spacer part 204, the first coupling line CPL1, the second coupling line CPL2, one lateral part of the first lateral element 31 and one lateral part of the second lateral element 32 have the same thickness along the second direction D2. In other embodiments, the second spacer part 204, the first coupling line CPL1, the second coupling line CPL2, one lateral part of the first lateral element 31 and one lateral part of the second lateral element 32 may be manufactured in different processes so that the second spacer part 204, the first coupling line CPL1, the second coupling line CPL2, one lateral part of the first lateral element 31 and one lateral part of the second lateral element 32 have different thickness along the second direction D2.

In the embodiment depicted in FIG. 3, since the spacer element 20 extends along the second direction D2 for separating the first coupling line CPL1 and the second coupling line CPL2, the spacer element 20 is able to isolate the signals transmitted on the first coupling line CPL1 from the signals transmitted on the second coupling line CPL2. Particularly when the signals transmitted on the first coupling line CPL1 and the signals transmitted on the second coupling line CPL2 have the same phase, the spacer element 20 is able to reduce the signal inter-coupling between the first coupling line CPL1 and the second coupling line CPL2, thereby preventing the amount of signal coupled from main signal line MSL from dropping and reducing the deterioration in coupler directivity. In addition, since the spacer element 20 is a conductor disposed between the first coupling line CPL1 and the second coupling line CPL2, the parts of the first coupling line CPL1 and the second coupling line CPL2 facing towards the spacer element 20 may further couple signals from the spacer element 20 (originated from the main signal line MSL), thereby increasing the overall coupling factor of the coupler structure 300. Also, since the coupler structure 300 includes the conductor layer 21 located on the fifth plane PL5, the parts of the first coupling line CPL1 and the second coupling line CPL2 facing towards the conductor layer 21 may further increase the inter-coupling with the conductor layer 21, thereby enabling the first coupling line CPL1 and the second coupling line CPL2 to couple more signals from the conductor layer 21 (originated from the main signal line MSL).

Moreover, in the embodiment depicted in FIG. 3, the first lateral element 31 and the second lateral element 32 extend along the second direction D2, the first lateral element 31 and the second lateral element 32 are respectively connected between the main signal line MSL and the conductor layer 21, and the projections of the first coupling line CPL1, the second coupling line CPL2 and the spacer element 20 on the first plane PL1 are located between the projection of the first lateral element 31 on the first plane PL1 and the projection of the second lateral element 32 on the first plane PL1. More specifically, the first coupling line CPL1 is at least partially surrounded by the first lateral element 31, the main signal line MSL and the spacer element 20, and the second coupling line CPL2 is at least partially surrounded by the second lateral element 32, the main signal line MSL and the spacer element 20. In the embodiment depicted in FIG. 3, the parts of the first coupling line CPL1 and the second coupling line CPL2 facing towards the first lateral element 31 and the second lateral element 32 may further couple signals from the first lateral element 31 and the second lateral element 32 (originated from the main signal line MSL), thereby increasing the overall coupling factor of the coupler structure 300.

Figure 4:
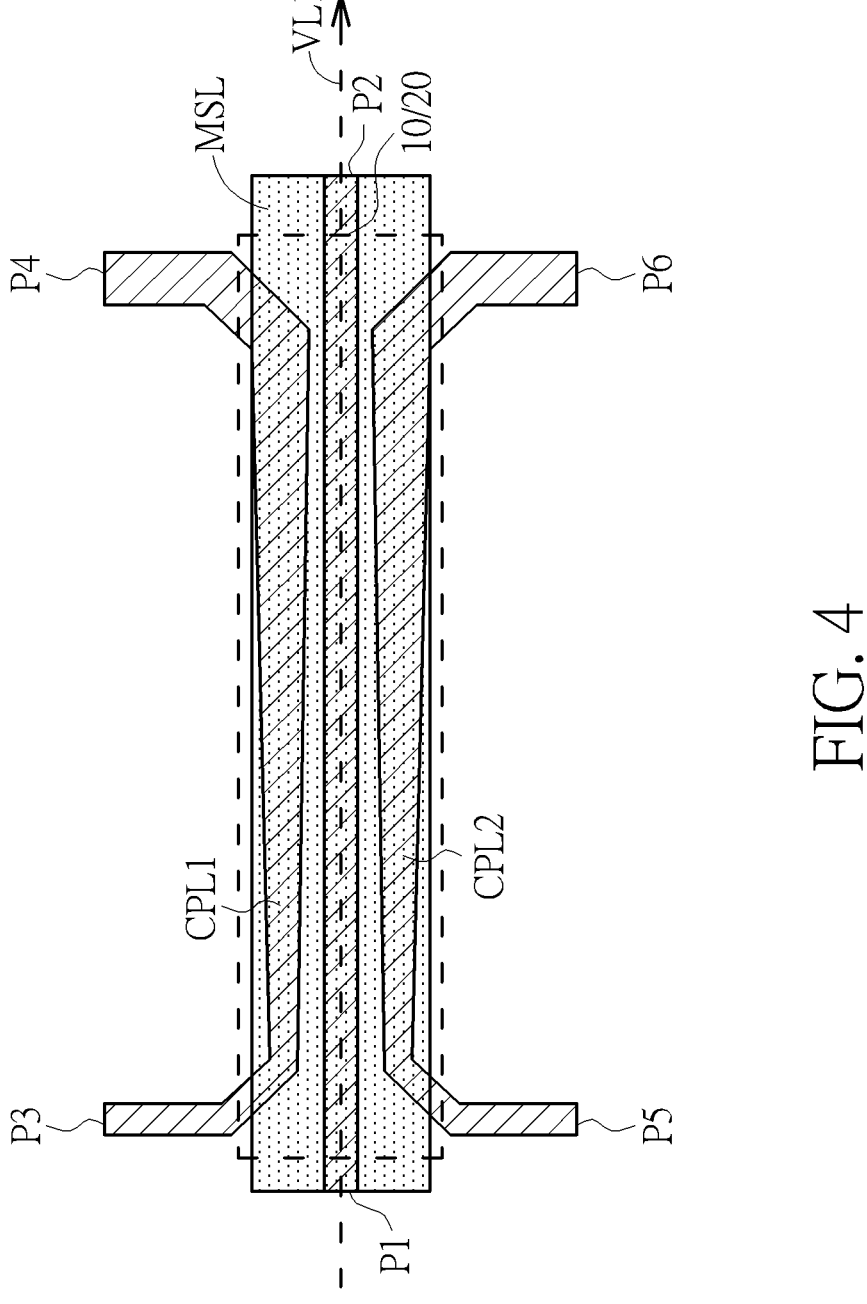
FIG. 4 is a top-view diagram of a coupler structure according to an embodiment of the present invention.
Figure 4:
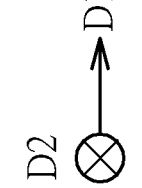
Figure 4:
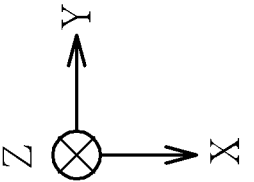
Figure 5A:
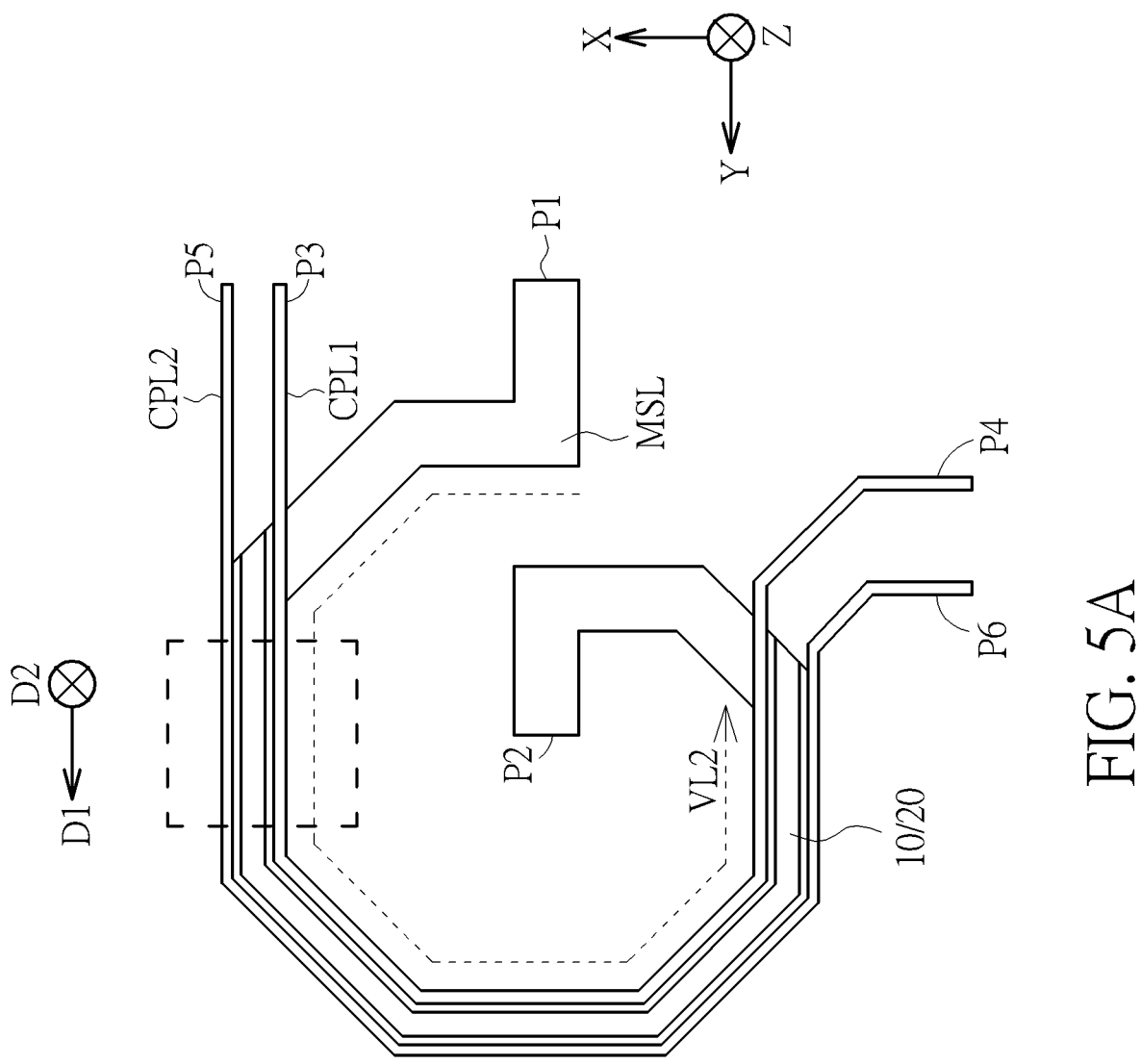
FIG. 5A is a top-view diagram of a coupler structure according to another embodiment of the present invention.
Figure 5B:
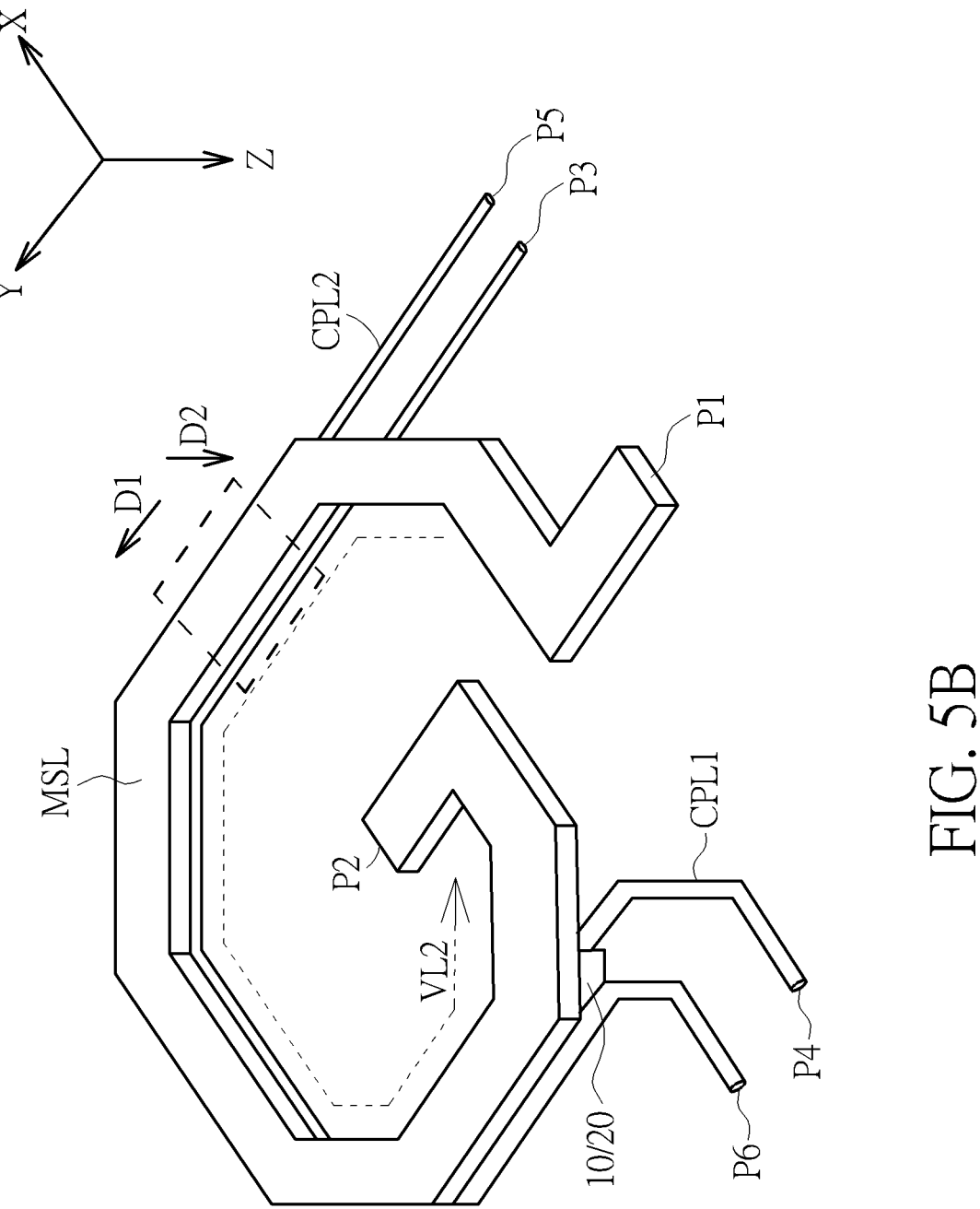
FIG. 5B is a top-view diagram of a coupler structure according to another embodiment of the present invention.

FIG. 4, FIG. 5A and FIG. 5B are top-view diagrams of the coupler structure along the X-Y plane according to embodiments of the present invention. P1 and P2 represent two nodes on the main signal line MSL, respectively. P3 and P4 represent two nodes on the first coupling line CPL1, respectively. P5 and P6 represent two nodes on the second coupling line CPL2, respectively.

Referring to FIGS. 1-4, the main signal MSL, the first coupling line CPL1 and the second coupling line CPL2 extend along a virtual line VL1. In the embodiments depicted in FIGS. 1-4, the virtual line VL1 is a straight line which extends along the first direction D1. The first direction D1 may be for example the direction of the Y-axis. The virtual line VL1 will be described with reference made to FIG. 4 in subsequent paragraphs.

In the present invention, a main coupling part of the main signal line MSL, a first coupling part of the first coupling line CPL1 and a second coupling part of the second coupling line CPL2 form a coupling structure which extends along a virtual line VL1. In an embodiment, the virtual line VL1 may be a straight line which extends along any direction. As depicted in FIG. 4, the main coupling part of the main signal line MSL (the main structure of the main signal line MSL inside the dotted square), the first coupling part of the first coupling line CPL1 (the main structure of the first coupling line CPL1 inside the dotted square) and the second coupling part of the second coupling line CPL2 (the main structure of the second coupling line CPL2 inside the dotted square) may extend along the first direction D1. The direction of signal transmission may be for example in parallel with the first direction D1. In the embodiment depicted in FIG. 4, the first direction D1 may be for example the direction of the Y-axis. Furthermore, the main coupling part of the main signal line MSL, the first coupling part of the first coupling line CPL1 and the second coupling part of the second coupling line CPL2 extending along the virtual line VL1 may include a first situation and a second situation. In the first situation, the main coupling part of the main signal line MSL, the first coupling part of the first coupling line CPL1 and the second coupling part of the second coupling line CPL2 are substantially in parallel with the virtual line VL1. In the second situation, the main coupling part of the main signal line MSL is substantially in parallel with the virtual line VL1, and the first coupling part of the first coupling line CPL1 and the second coupling part of the second coupling line CPL2 gradually extend away from or towards the virtual line VL1. In other words, the distance between the first coupling part of the first coupling line CPL1 and the virtual line VL1 may gradually change, and the distance between the second coupling part of the second coupling line CPL2 and the virtual line VL1 may gradually change. Or, the width of the first coupling part of the first coupling line CPL1 may vary along the X-axis, and the width of the second coupling part of the second coupling line CPL2 may vary along the X-axis.

In another embodiment, the virtual line VL2 may be a line of any shape and on any plane. As depicted in FIGS. 5A-5B, the virtual line VL2 may be a spiral line, and the main coupling part of the main signal line MSL (the main structure of the main signal line MSL inside the dotted square), the first coupling part of the first coupling line CPL1 (the main structure of the first coupling line CPL1 inside the dotted square) and the second coupling part of the second coupling line CPL2 (the main structure of the second coupling line CPL2 inside the dotted square) may extend along the virtual line VL2 on the X-Y plane. Furthermore, in the embodiment depicted in FIGS. 5A-5B, the partial structure inside the dotted square may be referenced with the embodiments depicted in FIGS. 1-3.

Figure 6:
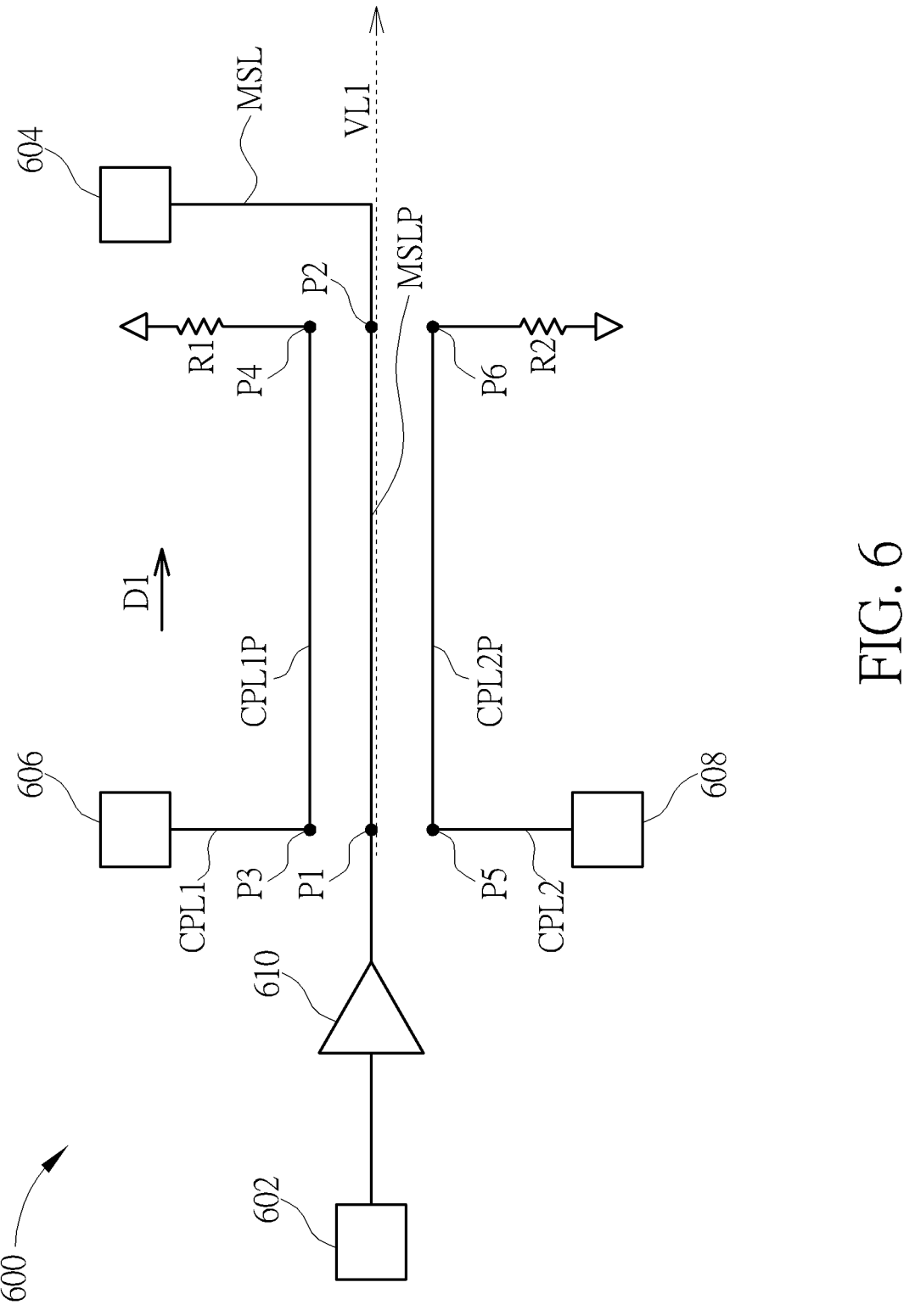
FIG. 6 is a diagram illustrating a radio frequency circuit implemented by a coupler structure according to an embodiment of the present invention.

FIG. 6 is a diagram illustrating a radio frequency (RF) circuit 600 implemented by a coupler structure according to an embodiment of the present invention. Each of the coupler structure 100 depicted in FIG. 1, the coupler structure 200 depicted in FIG. 2 and the coupler structure 300 depicted in FIG. 3 may be adopted in the RF circuit 600. The RF circuit 600 includes an RF signal transmitting end 602, a first RF signal output end 604, a second RF signal output end 606, a main signal line MSL, a first coupling line CPL1 and a second coupling line CPL2. It is to be noted that FIG. 6 is focused on the structural connection of each embodiment of the coupler structure when applied in the RF circuit 600. Therefore, the spacer element of the coupler structure 100, 200 or 300 is omitted. In the RF circuit 600, the main signal line MSL includes nodes P1 and P2, the first coupling line CPL1 includes nodes P3 and P4, and the second coupling line CPL2 includes nodes P5 and P6. In the embodiment depicted in FIG. 6, the partial structure of the main signal line MSL between nodes P1 and P2 is defined as a main coupling part MSLP, the partial structure of the first coupling line CPL1 between nodes P3 and P4 is defined as a first coupling part CPL1P, and the partial structure of the second coupling line CPL2 between nodes P5 and P6 is defined as a second coupling part CPL2P. In the embodiment depicted in FIG. 6, since the main coupling part MSLP, the first coupling part CPL1P and the second coupling line CPL2 are located near each other, the first coupling part CPL1P and the second coupling line CPL2 are able to couple signals from the main coupling part MSLP and the spacer element 10 or 20 depicted in the above-mentioned embodiments. As a result, the main coupling part MSLP, the first coupling part CPL1P and the second coupling line CPL2 may form a coupling structure. In the embodiment depicted in FIG. 6 (similar to the embodiment depicted in FIG. 4), the main coupling part MSLP, the first coupling part CPL1P and the second coupling line CPL2 may extend along the virtual line VL1 which is for example a straight line extending along the first direction D1.

In the embodiment depicted in FIG. 6, node P1 of the main signal line CPL1 is coupled to the RF signal transmission end 602, node P2 of the main signal line MSL is coupled to the first RF signal output end 604, and node P3 of the first coupling line CPL1 is coupled to the second RF signal output end 606, wherein the RF signal transmission end 602 may be for example an RF signal sending end, the first RF signal output end 604 may be for example coupled to a transmitting antenna, the second RF signal output end 606 may be for example coupled to an external device of the RF circuit 600. Also, the RF circuit 600 may further includes a power detector 608 which is coupled to node P5 of the second coupling line CPL2, wherein the power detector 608 may be for example a logarithmic power detector (Log-PD). The RF circuit 600 may further includes an amplifier circuit 610 which includes an input end coupled to the RF signal transmission end 602 and an output end coupled to node P1 of the main signal line MSL. In other words, the RF signal transmission end 602 is coupled to node P1 of the main signal line CPL1 via the amplifier circuit 610. In the embodiment depicted in FIG. 6, RF signals inputted via the RF signal transmission end 602 may be amplified by the amplifier circuit 610 and then transmitted to the first RF signal output end 604 along the main signal line MSL so as to be emitted by the transmitting antenna. On the other hand, node P4 of the first coupling line CPL1 may be coupled to a resistor R1, node P6 of the second coupling line CPL2 may be coupled to a resistor R2, wherein the resistors R1 and R2 may provide impedance matching or band-stop filtering on the RF signals. Furthermore, the first end of the resistor R1 is coupled to node P4 of the first coupling line CPL1, the second end of the resistor R1 is coupled to a reference voltage, the first end of the resistor R2 is coupled to node P6 of the second coupling line CPL2, and the second end of the resistor R2 is coupled to a reference voltage. In an embodiment, the power detector 608 is configured to output a direct current (DC) signal, and the RF circuit 600 is configured to output an alternative current (AC) signal via the second RF signal output end 606.

Figure 7:
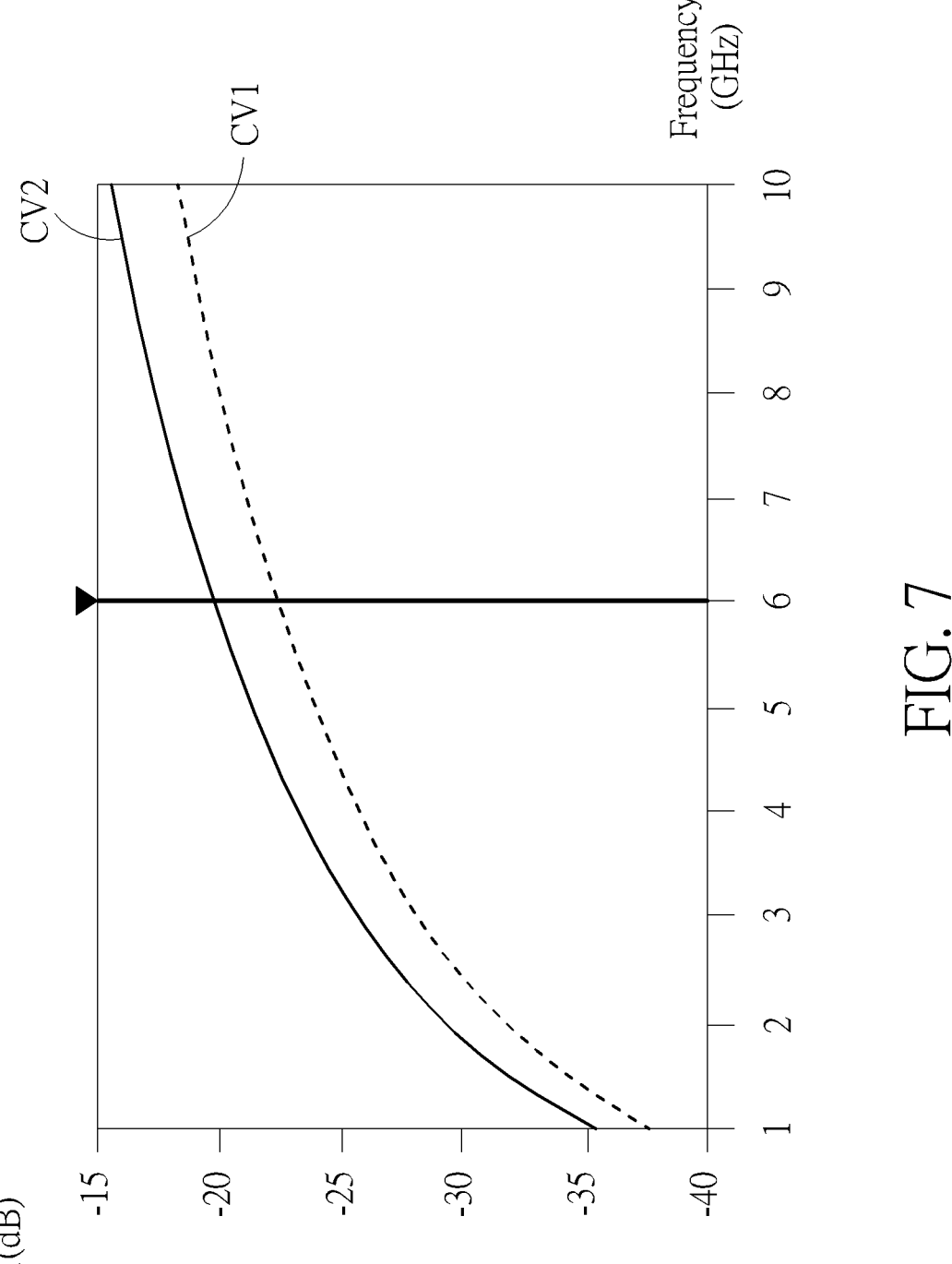
FIGS. 7-11 are diagrams illustrating the characteristics of the radio frequency circuit during operation according to embodiments of the present invention.

FIGS. 7-11 are diagrams illustrating the characteristics of the RF circuit 600 during operation according to an embodiment of the present invention. FIG. 7 depicts the relationship between the coupling factor CF31 (in dB) from the main signal line MSL to the first coupling line CPL1 and the signal frequency (in GHZ) when signals are inputted via node P1 of the main signal line CPL1 and received via node P3 of the first coupling line CPL1. Curve CV1 represents the characteristics of a comparable RF circuit (which adopts a coupler structure without the present spacer element and the length of the main signal line is for example 250 μm), and curve CV2 represents the characteristics of the present RF circuit 600 (which adopts the coupler structure 100, 200 or 300, and the length of the main signal line MSL is for example 250 μm). As depicted in FIG. 7, when the comparable RF circuit and the present RF circuit 600 transmit signals of the same frequency (such as 6 GHz) using the main signal line of the same length, the first coupling line CPL1 may couple more current from the main signal line MSL in the present RF circuit 600 than the comparable RF circuit (CV2>CV1).

Figure 8:
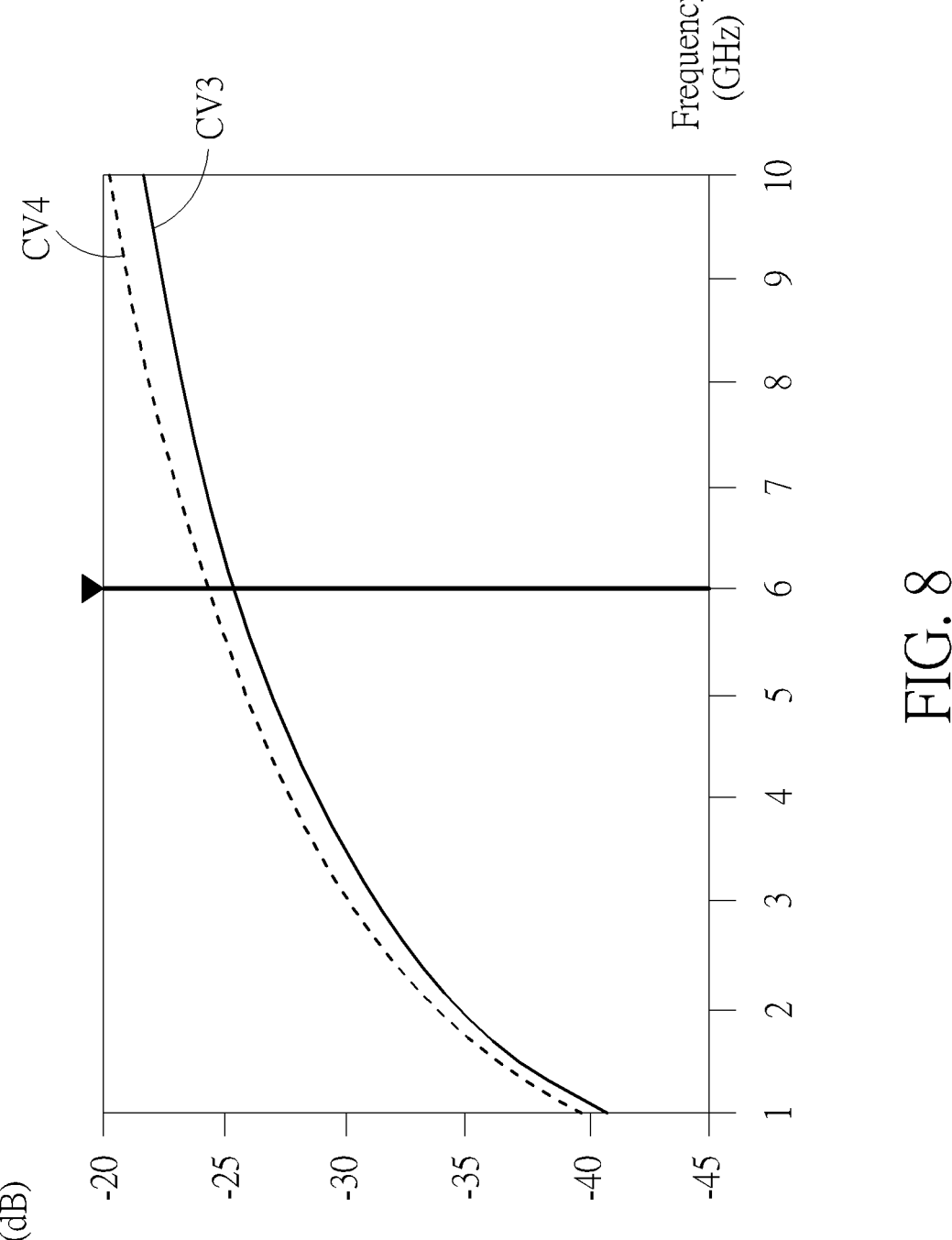

FIG. 8 depicts the relationship between the coupling factor CF53 (in dB) from the first coupling line CPL1 to the second coupling line CPL2 and the signal frequency (in GHz) when signals are inputted via node P3 of the first coupling line CPL1 and received via node P5 of the second coupling line CPL2. Curve CV3 represents the characteristics of the present RF circuit 600 (which adopts the coupler structure 100, 200 or 300, and the length of the main signal line MSL is for example 250 μm), and curve CV4 represents the characteristics of a comparable RF circuit (which adopts a coupler structure without the present spacer element and the length of the main signal line is for example 250 μm). As depicted in FIG. 8, when the comparable RF circuit and the present RF circuit 600 transmit signals of the same frequency (such as 6 GHz) using the main signal line of the same length, the first coupling line CPL1 may couple less current from the second coupling line CPL2 in the present RF circuit 600 than the comparable RF circuit (CV3<CV4). In other words, there is less interference between the first coupling line CPL1 and the second coupling line CPL2 in the present RF circuit 600, thereby improving signal isolation.

Figure 9:
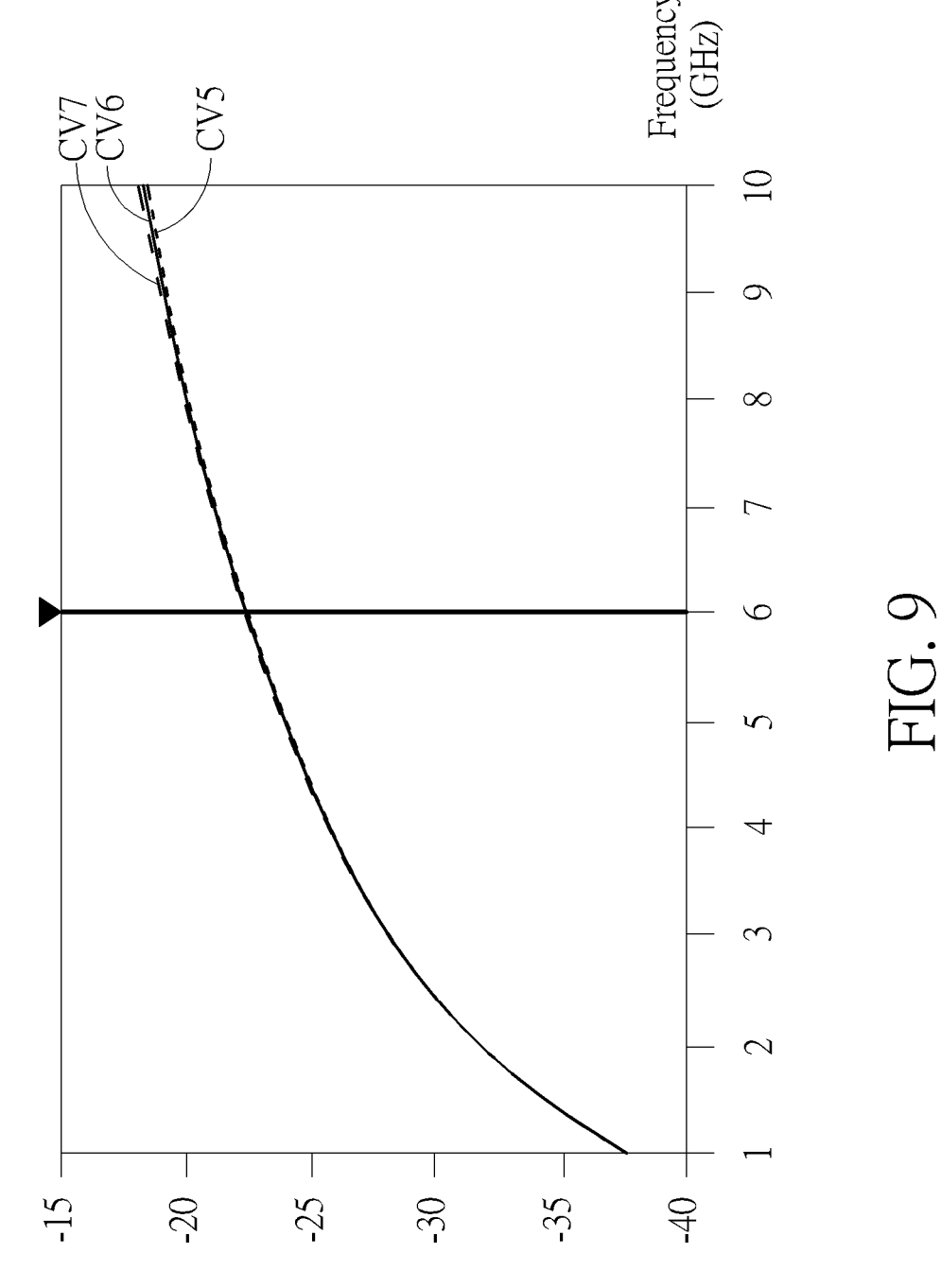

FIG. 9 depicts the relationship between the coupling factor CF31 (in dB) from the main signal line MSL to the first coupling line CPL1 and the signal frequency (in GHZ) when signals are inputted via node P1 of the main signal line CPL1 and received via node P3 of the first coupling line CPL1. Curve CV5 represents the characteristics of a comparable RF circuit (which adopts a coupler structure without the present spacer element and the length of the main signal line is for example 250 μm), curve CV6 represents characteristics of the present RF circuit 600 (which adopts the coupler structure 100, 200 or 300, and the main signal line MSL is a transmission line formed by a single metal layer with a length of for example 187 μm), and curve CV7 represents the characteristics of the present RF circuit 600 (which adopts the coupler structure 100, 200 or 300, and the main signal line MSL is a transmission line formed by multiple metal layers with a length of for example 194 μm). As depicted in FIG. 9, when the comparable RF circuit and the present RF circuit 600 transmit signals of the same frequency (such as 6 GHz), the first coupling line CPL1 may couple substantially the same amount of current from the main signal line MSL of a shorter length in the present RF circuit 600 than the comparable RF circuit.

Figure 10:
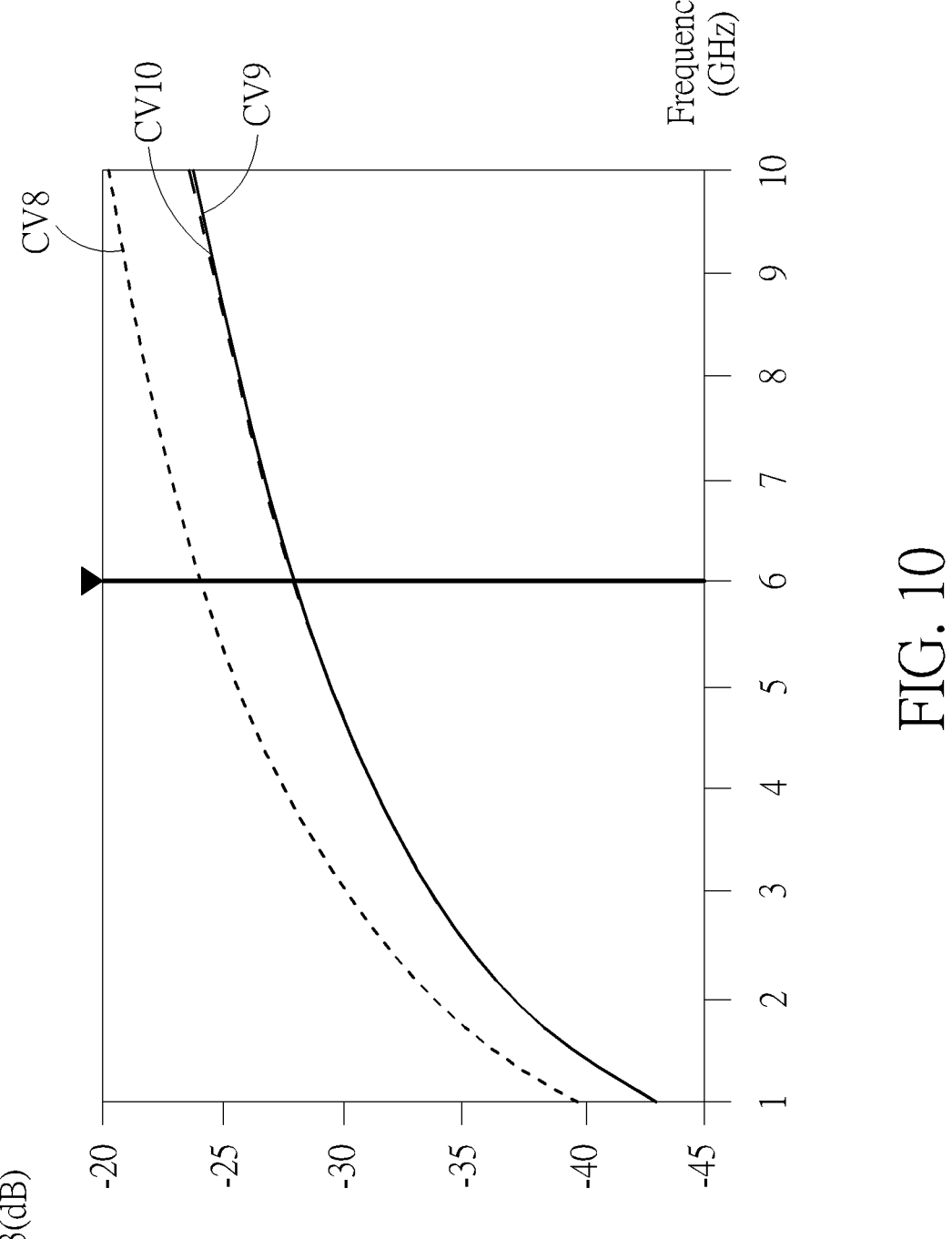

FIG. 10 depicts the relationship between the coupling factor CF53 (in dB) from the first coupling line CPL1 to the second coupling line CPL2 and the signal frequency (in GHz) when signals are inputted via node P3 of the first coupling line CPL1 and received via node P5 of the second coupling line CPL2. Curve CV8 represents the characteristics of a comparable RF circuit (which adopts a coupler structure without the present spacer element and the length of the main signal line is for example 250 μm), curve CV9 represents the characteristics of the present RF circuit 600 (which adopts the coupler structure 100, 200 or 300, and the main signal line MSL is a transmission line formed by a single metal layer with a length of for example 187 μm), and curve CV10 represents the characteristics of the present RF circuit 600 (which adopts the coupler structure 100, 200 or 300, and the main signal line MSL is a transmission line formed by multiple metal layers with a length of for example 194 μm). As depicted in FIG. 10, when the comparable RF circuit transmit signals of the same frequency (such as 6 GHz) using the 250 μm long main signal line and the present RF circuit 600 transmit signals of the same frequency (such as 6 GHz) using the 187 μm or 194 μm long main signal line MSL, and when the coupling factors of the comparable RF circuit and the present RF circuit 600 are substantially the same, the first coupling line CPL1 may couple less current from the second coupling line CPL2 in the present RF circuit 600 than the comparable RF circuit (CV9<CV8 and CV10<CV8). In other words, there is less interference between the first coupling line CPL1 and the second coupling line CPL2 in the present RF circuit 600, thereby improving signal isolation.

Figure 11:
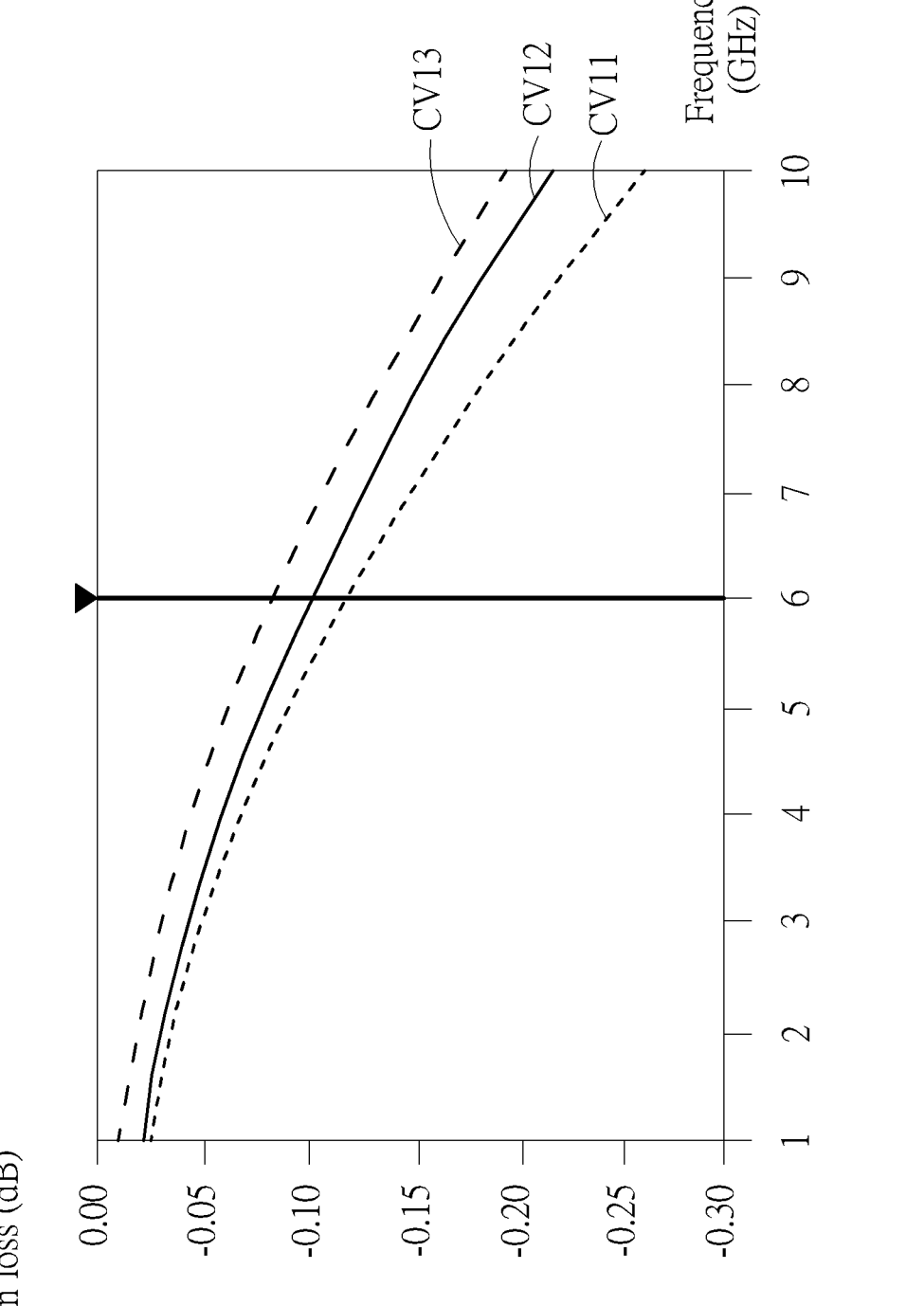

FIG. 11 depicts the relationship between the insertion loss (in dB) of the main signal line and the signal frequency. Curve CV11 represents the characteristics of a comparable RF circuit (which adopts a coupler structure without the present spacer element and the length of the main signal line is for example 250 μm), curve CV12 represents the characteristics of the present RF circuit 600 (which adopts the coupler structure 100, 200 or 300, and the main signal line MSL is a transmission line formed by a single metal layer with a length of for example 187 μm), and curve CV13 represents the characteristics of the present RF circuit 600 (which adopts the coupler structure 100, 200 or 300, and the main signal line MSL is a transmission line formed by multiple metal layers with a length of for example 194 μm). As depicted in FIG. 11, when the comparable RF circuit transmit signals of the same frequency (such as 6 GHz) using the 250 μm long main signal line and the present RF circuit 600 transmit signals of the same frequency (such as 6 GHz) using the 187 μm or 194 μm long main signal line, and when the coupling factors of the comparable RF circuit and the present RF circuit 600 are substantially the same, the insertion loss of the main signal line MSL in the present RF circuit 600 is lower than that in the comparable RF circuit (CV12 is less negative than CV11, and CV13 is less negative than CV11).

In conclusion, the coupler structure of the present invention can increase coupling factor and improve signal isolation, thereby reducing insertion loss. When applied in an RF circuit, the coupler structure of the present invention can be used to monitor RF power level and is able to reduce signal loss of the transmission line and the load.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A coupler structure, comprising:
a main signal line located on a first plane;
a first coupling line located on a second plane, wherein the second plane is in parallel with the first plane and the second plane is different from the first plane;
a second coupling line located on a third plane, wherein the third plane is in parallel with the first plane and third plane is different from the first plane; and
a spacer element connected to the main signal line, wherein:
a projection of the spacer element on the first plane is located between a projection of the first coupling line on the first plane and a projection of the second coupling line on the first plane;

the main signal line, the first coupling line and the second coupling line extend along a virtual line;

the virtual line extends along a first direction;

the spacer element extends along a second direction for separating the first coupling line and the second coupling line;

the second direction is not in parallel with the first direction;

the spacer element is a conductor;

the spacer element includes a first spacer part and a second spacer part;

the first spacer part is connected between the main signal line and the second spacer part along the second direction;

the second spacer part is located on a fourth plane, wherein the fourth plane is in parallel with the first plane and the fourth plane is different from the first plane; and the first spacer part includes a plurality of conductor vias disposed along the first direction or is a conductor wall extending along the first direction.

2. The coupler structure of claim 1, wherein the virtual line is a straight line which extends along a first direction.

3. The coupler structure of claim 1, wherein the first coupling line and the second coupling line couple signals from the main signal line and the spacer element.

4. The coupler structure of claim 1, wherein:

the second spacer part is a conductor block extending along the first direction; and the second plane, the third plane and the fourth plane are coplanar.

5. The coupler structure of claim 1, wherein a first node of the main signal line is connected to a radio frequency (RF) signal transmitting end, a second node of the main signal line is connected to a first RF signal output end, a first node of the first coupling signal line is connected to a second RF signal output end, and a first node of the second coupling signal line is connected to a power detector.

6. A coupler structure, comprising:

a main signal line located on a first plane;

a first coupling line located on a second plane, wherein the second plane is in parallel with the first plane and the second plane is different from the first plane;

a second coupling line located on a third plane, wherein the third plane is in parallel with the first plane and the third plane is different from the first plane; and a spacer element connected to the main signal line; and a conductor layer located on a fifth plane, wherein:

the main signal line, the first coupling line and the second coupling line extend along a virtual line;

the virtual line extends along a first direction;

the spacer element extends along a second direction for separating the first coupling line and the second coupling line;

the second direction is not in parallel with the first direction;

the spacer element is a conductor;

a projection of the spacer element on the first plane is located between a projection of the first coupling line on the first plane and a projection of the second coupling line on the first plane;

the fifth plane is in parallel with the first plane, and the fifth plane is different from the first plane, the second plane and the third plane;

the spacer element is connected between the main signal line and the conductor layer along the second direction; and the first coupling line and the second coupling line are located between the main signal line and the conductor layer.

7. The coupler structure of claim 6, wherein:

the spacer element includes a first spacer part, a second spacer part and a third spacer part;

the first spacer part is connected to the main signal line, the third spacer part is connected to the conductor layer, and the second spacer part is connected between the first spacer part and the third spacer part;

the first spacer part includes a plurality of first conductor vias disposed along the first direction or is a first conductor wall extending along the first direction; and the third spacer part includes a plurality of second conductor vias disposed along the first direction or is a second conductor wall extending along the first direction.

8. The coupler structure of claim 7, wherein:

the second spacer part is a conductor block extending along the first direction;

the second spacer part is located on a fourth plane;

the fourth plane is in parallel with the first plane;

the fourth plane is different from the first plane; and the second plane, the third plane and the fourth plane are coplanar.

9. The coupler structure of claim 6, further comprising a first lateral element and a second lateral element respectively connected between the main signal line and the conductor layer along the second direction, wherein:

the spacer element is located between the first lateral element and the second lateral element;

the first coupling line is at least partially surrounded by the first lateral element, the main signal line, the spacer element and the conductor layer; and the second coupling line is at least partially surrounded by the second lateral element, the main signal line, the spacer element and the conductor layer.

10. A radio frequency (RF) circuit, comprising:

an RF signal transmitting end;

a first RF signal output end;

a second RF signal output end;

a main signal line located on a first plane, wherein a first node of the main signal line is connected to the RF signal transmitting end and a second node of the main signal line is connected to the first RF signal output end;

a first coupling line located on a second plane, wherein the second plane is in parallel with the first plane, the second plane is different from the first plane, and a first node of the first coupling signal line is connected to the second RF signal output end;

a second coupling line located on a third plane, wherein the third plane is in parallel with the first plane and the third plane is different from the first plane;

a spacer element connected to the main signal line; and a power detector coupled to a first node of the second coupling line, wherein:

a projection of the spacer element on the first plane is located between a projection of the first coupling line on the first plane and a projection of the second coupling line on the first plane;

a main coupling part of the main signal line, a first coupling part of the first coupling line, a second coupling part of the second coupling line and the spacer element form a coupling structure; and the main signal line, the first coupling part and the second coupling part extend along a virtual line;

the virtual line extends along a first direction;

the spacer element extends along a second direction for separating the first coupling line and the second coupling line;

the second direction is not in parallel with the first direction;

the spacer element is a conductor;

the spacer element includes a first spacer part and a second spacer part;

the first spacer part is connected between the main signal line and the second spacer part along the second direction;

the second spacer part is located on a fourth plane, wherein the fourth plane is in parallel with the first plane and the fourth plane is different from the first plane; and the first spacer part includes a plurality of conductor vias disposed along the first direction or is a conductor wall extending along the first direction.

11. The RF circuit of claim 10, wherein the virtual line is a straight line which extends along a first direction.

12. The RF circuit of claim 10, wherein the first coupling part of the first coupling line and the second coupling part of the second coupling line couple signals from the main coupling part of the main signal line and the spacer element.

13. The RF circuit of claim 10, further comprising an amplifier circuit, wherein an input end of the amplifier circuit is coupled to the RF signal transmitting end and an output end of the amplifier circuit is coupled to the first node of the main signal line.

14. The RF circuit of claim 10, wherein:

a second node of the first coupling line is coupled to a first resistor; and a second node of the second coupling line is coupled to a second resistor.

15. The RF circuit of claim 10, wherein the first RF signal output end is coupled to a transmitting antenna.

16. The RF circuit of claim 10, wherein the power detector is a logarithmic power detector.

17. The RF circuit of claim 10, wherein:

the virtual line extends along a first direction;

the spacer element extends along a second direction for separating the first coupling part and the second coupling part;

the second direction is not in parallel with the first direction; and the spacer element is a conductor.

18. The RF circuit of claim 10, wherein:

the power detector outputs a direct current signal; and an alternative current signal is outputted via the second RF signal output end.

* * * * *